United States Patent [19]

Petty

[11] Patent Number: 4,870,301
[45] Date of Patent: Sep. 26, 1989

[54] DIFFERENTIAL EMITTER-COUPLED-LOGIC BUS DRIVER

[75] Inventor: Cleon Petty, Tempe, Ariz.

[73] Assignee: Motorola, Inc., Schaumberg, Ill.

[21] Appl. No.: 240,339

[22] Filed: Sep. 6, 1988

[51] Int. Cl.[4] .......................................... H03K 19/086
[52] U.S. Cl. .................................... 307/455; 307/473; 307/495; 307/296.1
[58] Field of Search ............... 307/443, 455, 473, 475, 307/494–495, 296.1

[56] References Cited

U.S. PATENT DOCUMENTS

| | | | |
|---|---|---|---|
| 4,490,630 | 12/1984 | Freeman | 307/473 X |
| 4,596,940 | 6/1986 | Schuppan et al. | 307/455 X |
| 4,682,058 | 7/1987 | Gal | 307/455 X |
| 4,709,169 | 11/1987 | Ashton et al. | 307/455 |
| 4,719,371 | 1/1988 | Fujita et al. | 307/455 |
| 4,748,346 | 5/1988 | Emori | 307/443 X |
| 4,751,406 | 6/1988 | Wilson | 307/296.1 X |

OTHER PUBLICATIONS

Marcello et al., "Tri-State Read/Write Control Circuit", *IBM T. D. B.*, vol. 24, No. 1B, Jun. 1981, pp. 480–482.

Freeman, "Three-State Off-Chip Driver", *IBM T.D.B.*, vol. 26, No. 7A, Dec. 1988, pp. 3255–3256.

Madyiwa, "Tri-State Amplifier", *IBM T.D.B.*, vol. 20, No. 7, Dec. 1977.

*Primary Examiner*—David Hudspeth
*Attorney, Agent, or Firm*—Mike Bingham

[57] ABSTRACT

An Emitter-Coupled-Logic (ECL) bus driver circuit provides differential ECL output signals designed for bus driving applications in response to receiving differential logic input signals and when disabled by a disabling signal places the differential outputs in a low state wherein a high impedance is presented thereat. The circuit includes a single logic gate and enable/disable gate that places the logic circuit in the ECL tri-level state using incremental current in conjuction with the current drain of the logic gate to reduce current drain otherwise required. In addition, time delay through the bus driver circuit is maintained at a minimum since only one gate is required to provide the differential function.

6 Claims, 1 Drawing Sheet

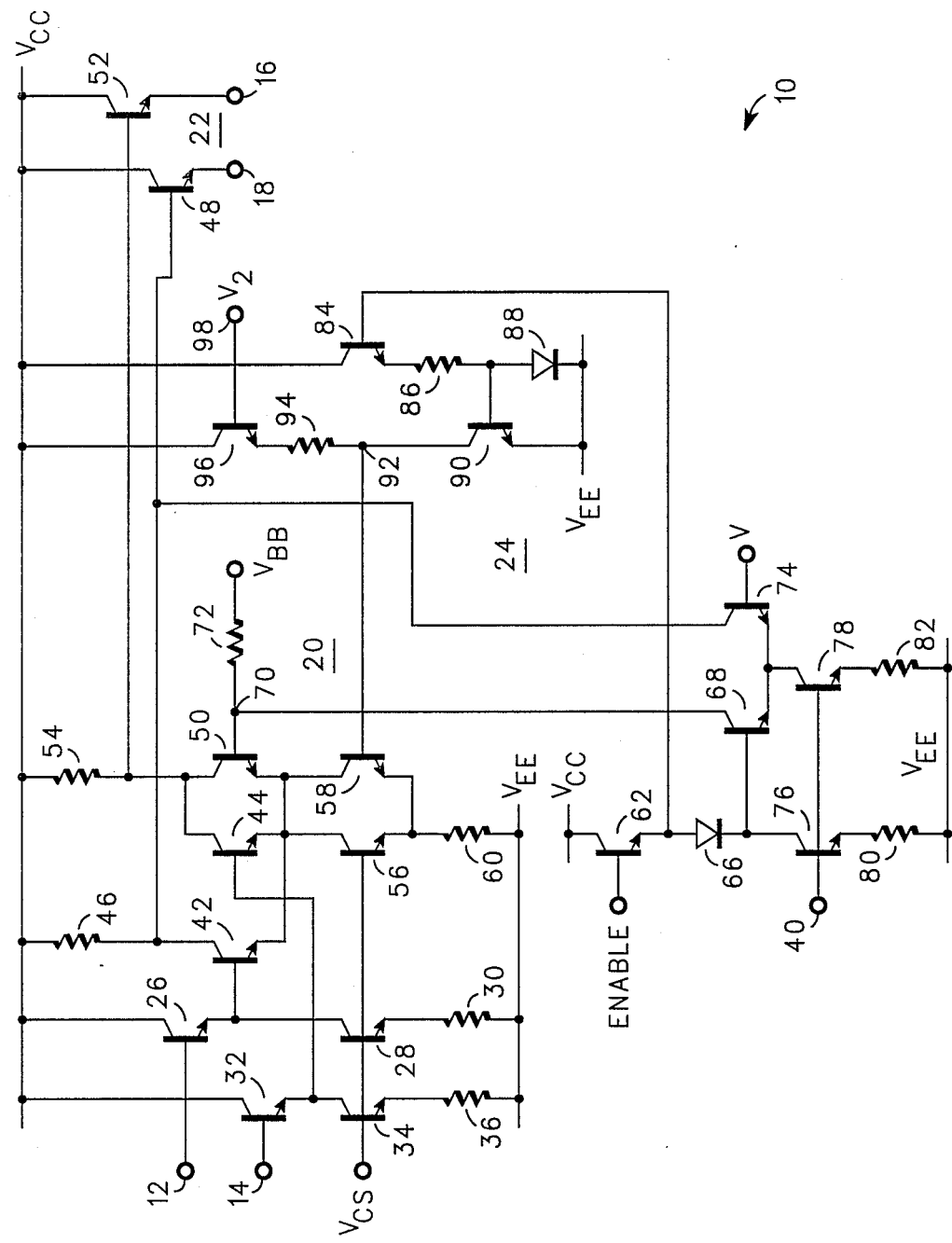

DIFFERENTIAL EMITTER-COUPLED-LOGIC BUS DRIVER

BACKGROUND OF THE INVENTION

The present invention is related to logic circuits and, more particularly, to an Emitter-Coupled-Logic (ECL) circuit for providing differential outputs designed for bus driving applications.

Tri-state ECL bus drive integrated circuits are well known in the art. For instance, the MC10H123, Bus Driver, manufactured by Motorola, Inc., is such a circuit. These prior art bus drivers provide single-ended outputs consisting of Nor gates designed for bus driving applications as is well understood. Generally, the output of the bus driver is taken through an emitter-follower stage which, when disabled, goes low to produce an high impedance to the bus in the tri-level state.

At present, there is no known differential ECL bus driver integrated circuit that provides differential output logic signals for driving a bus in response to receiving differential input logic signals. It is desirable to provide differential outputs in order to drive a pair of bus lines differentially while not increasing additional time delays due to additional gate requirements. In addition, it is also desirable to maintain the necessary current drain to a minimum during the tri-state off condition when the differential outputs are in the high impedance state.

Hence, there is a need for an integrated ECL bus driver circuit for providing differential output logic states while minimizing gate time delays and current drain requirements.

SUMMARY OF THE INVENTION

Accordingly, it is an object of the present invention to provide an improved ECL bus driver circuit.

It is another object of the present invention to provide an improved ECL bus driver circuit for supplying differential logic output signals designed for driving bus lines.

Still another object of the present invention is to provide a differential ECL integrated bus driver circuit in which gate delay and current drain requirements are minimized.

The above and other objects, features, and advantages of the present invention will be better understood from the following detailed description taken in conjunction with the accompanying drawings in which a differential ECL bus driver circuit is described comprising a single input gate responsive to differential input logic signals for differentially driving a pair of emitter-follower output stages and including an enable/disable gate arrangement for placing the driver circuit in a tri-state to present a high impedance at the outputs thereof while minimizing current drain requirments.

BRIEF DESCRIPTION OF THE DRAWING

The single figure is a schematic diagram illustrating the ECL bus driver circuit of the present invention.

DETAILED DESCRIPTION OF THE PREFERRED EMBODIMENT

Turning now to the single Figure there is shown differential ECL bus driver circuit 10 of the present invention. ECL bus driver circuit 10 is responsive to ECL differential logic signals applied at inputs 12 and 14 for providing ECL differential output signals at outputs 16 and 18 having standard ECL output levels of $V_{OH}$ and $V_{OL}$ as will be explained. Bus driver circuit 10 is comprised of input gate 20, emitter-follower output stage 22 and enable gate 24. Input gate 20 includes transistor 26 the base of which is coupled to input 12 and its collector-emitter conduction of coupled between positive supply $V_{cc}$ and negative supply $V_{ee}$ through the collector-emitter condution path of transistor 28 and series connected resistor 30. Similarly, the complementary input of gate 20 is coupled to the base of transistor 32 the collector-emitter condution path of which is coupled between $V_{cc}$ and $V_{ee}$ through the collector-emitter conduction path of transistor 34 and series connected resistor 36. The bases of transistors 28 and 34 are coupled to a first reference bias potential $V_{cs}$ at terminal 40. The emitter of transistors 26 and 32 are respectively coupled to the bases of transistors 42 and 44 with the collector of former being coupled to $V_{cc}$ via resistor 46. The collector of transistor 42 is also coupled to the base of emitter-follower output transistor 48 while its emitter is coupled to the emitters of transistors 44 and 50. The collectors of transistors 44 and 50 are directly coupled to the base of emitterfollower output transistor 52 and via resistor 54 to $V_{cc}$. The interconnected emitters of transistors 44 and 50 are coupled to the collectors of transistors 56 and 58 with the emitter of transistor 58 being coupled with the emitter of transistor 56 to $V_{ee}$ through resistor 60. The base of transistor 56 is coupled to terminal 40. Transistors 26 and 42 can be considered as first and second emitter-follower transistors for providing a first differential function between the first input and output of logic gate 20 and the input of emitterfollower output transistor stage 48. Similarly, transistors 32 and 44 can be considered as a second pair of emitter-follower transistors for providing the complementary or second differential function between the second input and output of logic gate 20 and the input of emitter-follower output transistor stage 52.

Enable gate 24 includes transistor 62 the collector of of which is coupled to $V_{cc}$ and whose base is coupled to enable input terminal 64. The emitter of transistor 62 is coupled through diode 66 to the base of transistor 68 the collector of which is coupled to node 70 and via resistor 72 to a second reference voltage $V_{bb}$. The emitter of transistor 68 is coupled to the emitter of transistor 74 having its collector coupled to the base of transistor 48 and its base coupled to a third reference voltage $V_1$. The emitters of transistors 68 and 74 as well as the base of the former are coupled to the collectors of respective current source transistors 78 and 76, the bases of which are coupled to terminal 40. The emitters of the current source transistors are returned to $V_{ee}$ via respective resistors 80 and 82. The emitter of transistor 62 is also coupled to the base of transistor 84 collector of which is returned to positive voltage supply $V_{cc}$. The emitter of transistor 84 is coupled to negative voltage supply $V_{ee}$ through series connected resistor 86 and diode 88 with the interconnection therebetween being coupled to the base of transistor 90. The collector-emitter conduction path of transistor 90 is coupled between node 92 and $V_{ee}$ with node 92 being coupled to the base of transistor 58. Node 92 is coupled to the emitter of transistor 96 via resistor 94 with the collector and base of the transistor being coupled to $V_{cc}$ and terminal 98 respectively. Terminal 98 is supplied with a fourth reference voltage suply, $V_2$. Transistors 50 and 58 form a part of enable gate 24 to supply an incremental current as circuit 10 is disabled to ensure that transistor 52 is turned off during the disable state as will be explained hereinafter. These two transistors may be considered as being coupled in parallel to the complementary output of logic gate 20.

In normal operation, enable input terminal 64 is supplied with a high logic signal. This turns on transistor 62, forcing it to a high ECL state which also causes transistors 68 and 84 to go to a high state. Transistor 68 thus forces transistor 50 to a low state such that it has no effect on the operation of bus driver circuit 10. Likewise, with transistor 84 in a high state, transistor 90 is forced to a high state which disables or turns off transistor 58 since the collector of transistor 90 is at a low voltage. Thus, if input 12 is high (input 14 low) transistor 26 is placed in a high state while transistor 32 is forced to a low state. As transistor 26 is in a high logic state transistor 42 is placed in a high logic state which forces its collector to go low while causing transistor 44 to go to a low state thus forcing its collector to go high. This state forces the output states at outputs 16 and 18 to become equal to $V_{OH}$ and $V_{OL}$ respectively, as the emitters of transistors 50 and 48 follow the voltage at the collectors of transistors 44 and 42 respectively. Likewise, if input 12 goes low (input 14 high) transistor 26 is placed in a low logic state while transistor 32 goes to a high state. Transistor 44 will then go to a high state which forces its collector to go low. This forces a low ECL level state at output 16 ($V_{OL}$). Simultaneously, transistor 42 is put in a low state by transistor 26 being in a high state thereby forcing its collector high. Output 18 will thus go to the high ECL level state, $V_{OH}$. Hence, during normal operation, differential ECL output logic levels are produced at outputs 16 and 18 in response to differential ECL input signals applied to input terminals 12 and 14.

In the disable state bus driver circuit 10 is placed in the ECL tri-level state wherein the outputs of the bus driver circuit are forced to a high impedance state in order that driver circuit 10 will not have any effect on the bus line to which it may be connected. The tri-level state is initiated by a disable input signal being applied to terminal 64. With a low logic input signal applied to terminal 64 transistor 62 is forced to a low state. Hence, transistors 68 and 84 go to a low logic state to force transistors 74 and 94 to a high state. As transistors 74 goes to a high state, transistor 48 is turned off which forces output 18 to go to a high impedance state. Transistor 90 is placed in a high state by transistor 84 being in a low state which causes transistor 58 turn on. Transistor is therefore turned on harder to source an additional incremental current therethrough while transistor 56 is turned off. This incremental current flow in transistor 50, in conjunction with the normal current flow through the transistor is sufficient to turn off transistor 52 thereby forcing output 16 to a high impedance state. It is noted that during normal operation, when bus driver circuit 10 is enabled, that transistor 58 is turned off. Hence, current drain on the operation of bus driver circuit 10 is reduced as the incremental current required for disabling output transistor 52 in the tri-level state is only produced during the disabled state operation of bus driver circuit 10.

Hence, what has been described above is a novel differentially operated ECL bus driver circuit for providing differential outputs designed to drive bus lines to which the circuit is suited to be operated. A true trilevel state is provided in response to a disable signal applied to the bus driver circuit. The normal gate current is utilized to supply additional current required during the disable state which results in a current saving when compared to discrete type ECL differential bus driver circuits.

What is claimed is:

1. An Emitter-Coupled-Logic (ECL) circuit for providing differential ECL output signals at first and second outputs responsive to differential logic input signals applied thereto at first and second inputs, comprising:
   first and second emitter-follower transistor output stages each having an input and an output, said outputs being respectively coupled to said first and second outputs of the circuit;
   a logic gate having first and second inputs and outputs, said first and second outputs being coupled respectively to said input of said first and second emitter-follower transistor output stages, said logic gate including first circuit means coupled between said first input and output of said logic gate responsive to a logic input signal applied thereto for driving said first emitter-follower transistor output stage, and second circuit means coupled between said second input and output of said logic gate responsive to the complementary of said logic input signal for driving said second emitterfollower transistor output stage; and
   third circuit means responsive to a disable signal applied to an input thereof for disabling said first and second emitter-follower transistor output stages, said third circuit means having first and second outputs coupled respectively to said first and second outputs of said logic gate and including additional circuit means coupled to said second output for providing an incremental current flow through said second circuit means in response to said disable signal.

2. The ECL circuit of claim 1 wherein said second circuit means includes:
   a first transistor configured as an emitter-follower with the base coupled to said second input of logic gate;
   a second transistor the base thereof being coupled to the emitter of said first transistor and the collector being coupled to said second output of said logic circuit; and
   first current supply means coupled to said emitter of said first transistor and the emitter of said second transistor for supplying bias currents.

3. The ECL circuit of claim 2 wherein said third circuit means includes:
   a third transistor configured as an emitter-follower with the base thereof coupled to said input of said third circuit means;
   a fourth transistor having a base coupled to said emitter of said third transistor, an emitter and a collector coupled to a first reference voltage supply;
   second current supply means coupled to said emitters of said third and fourth transistors for supplying bias currents;
   a fifth transistor having a base coupled to a second reference voltage supply, an emitter coupled to said emitter of said fourth transistor and a collector coupled to said first output of said logic gate; and
   fourth circuit means having an input coupled to said emitter of said third transistor and an output for providing an enabling output signal at said output responsive to said disabling signal.

4. The ECL circuit of claim 3 wherein said additional circuit means includes:
- a sixth transistor having a base coupled to said collector of said fourth transistor, an emitter coupled to said emitter of said second transistor and a collector coupled to said second output of said logic gate; and
- a seventh transistor having a base coupled to said output of said fourth circuit means, an emitter coupled to said first current supply means and a collector coupled to said emitter of said sixth transistor.

5. The ECL circuit of claim 4 wherein said fourth circuit means includes:
- an eight transistor having a base coupled to said emitter of said third transistor, a collector coupled to a first power supply conductor to which is supplied a source of positive supply voltage and an emitter; and
- a ninth transistor having a base coupled to said emitter of said eight transistor, a collector coupled to said output of said fourth circuit means and an emitter coupled to a second power supply conductor to which is supplied a source of negative supply voltage.

6. The ECL circuit of claim 5 including:
- a tenth transistor having a base coupled to a third voltage reference supply, an emitter coupled to said output of said fourth circuit means and a collector coupled said first power supply conductor;
- first diode means coupled between said emitter of said third transistor and said base of said fourth transistor; and
- second diode means coupled between said emitter of said sixth transistor and said second power supply conductor.

* * * * *